United States Patent
Higuchi et al.

(10) Patent No.: US 6,720,599 B2
(45) Date of Patent: Apr. 13, 2004

(54) FERROELECTRIC MEMORY AND ELECTRONIC APPARATUS

(75) Inventors: Takamitsu Higuchi, Matsumoto (JP); Setsuya Iwashita, Nirasaki (JP); Hiromu Miyazawa, Nagano-ken (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/105,001

(22) Filed: Mar. 22, 2002

(65) Prior Publication Data

US 2002/0154554 A1 Oct. 24, 2002

(30) Foreign Application Priority Data

Mar. 26, 2001 (JP) .................. 2001-088842
Mar. 14, 2002 (JP) .................. 2002-070806

(51) Int. Cl.$^7$ ........................ H01L 31/119
(52) U.S. Cl. ............... 257/295; 257/296; 257/297; 438/3; 438/257
(58) Field of Search ............... 257/195–297, 257/301, 303, 306, 309, 753, 763–765; 438/3, 257; 365/200; 428/446, 472, 689, 697–702

(56) References Cited

U.S. PATENT DOCUMENTS

| | | | |
|---|---|---|---|
| 5,470,668 A | * 11/1995 | Wu et al. | 428/688 |
| 6,509,601 B1 | * 1/2003 | Lee et al. | 257/310 |
| 6,541,279 B2 | * 4/2003 | Hayashi et al. | 438/3 |
| 6,573,542 B2 | * 6/2003 | Bruchhaus et al. | 257/295 |
| 2003/0001189 A1 | * 1/2003 | Fujiwara et al. | 257/303 |

FOREIGN PATENT DOCUMENTS

JP 07-161422 5/1995

OTHER PUBLICATIONS

Ishikawa, et al, Growth of Epitaxial Sr $Bi_2Ta_2O_9$ Thin Films by Pulse–introduced Metalorganic Chemical Vapor Deposition 99/24/1999, Jpn.J. Appl.Phys. Vol 39 (1999) pp. 2102–2109.

Mitsuya, et al, Property Improvement of 75 nm–thick Directly–crystallized Sr $Bi_2Ta_2O_9$ Thin Films by Pulse–introduced Metalorganic Chemical Vapor Deposition at Low Temperature, May 23, 2001, Jpn. J. Appl.Phys. vol. 40 (2001) pp. L758–L760.

Nukaga, et al, Local Epitaxial Growth of (103) One–Axis–Oriented Sr $Bi_2Ta_2O_9$ Thin Films Prepared at Low Deposition Temperature by Metalorganic Chemical Vapor Deposition and Their Electrical Properties, Jun. 28, 2001, Jpn.J. Appl.Phys. Vol 40 (2001) pp. 5595–5598.

* cited by examiner

Primary Examiner—David Nelms
Assistant Examiner—Long Tran
(74) Attorney, Agent, or Firm—Harness, Dickey & Pierce, P.L.C.

(57) ABSTRACT

In case capacitor-type ferroelectric memory is formed by using $SrB_2Ta_2O_9$ having superior fatigue resistance for ferroelectric layer, non-orientation layer is inferior in angularity, and SBT of orientation layer is subject to be oriented to c-axis orientation, polarization moment of a-axis direction was not effectively used, on Si single crystal substrate, a buffer layer and a bottom electrode layer composed of conductive oxide having perovskite structure are grown in epitaxially, furthermore the epitaxial growth of ferroelectric layer composed of SBT is performed with slanting c-axis to the substrate by 45 to 55 degrees.

12 Claims, 3 Drawing Sheets

FERROELECTRIC MEMORY AND ELECTRONIC APPARATUS

BACKGROUND OF THE INVENTION

1. Field of the Invention

The present invention relates to a ferroeletric memory using metal oxide layer and an electronic apparatus using the ferroelectric memory.

2. Description of Related Art

Ferroelectric memory has udergone rapid development in recent years as a form of nonvolatile memory employing a ferroelectric substance. A ferroelectric memory can be categorized into a capacitor type forming a 1T/1C structure or the like if a Ferroelectric is used as a capacitor and an MFSFET in which Ferroelectric is used type as a gate insulator for a field effect transistor instead of $SiO_2$. Although an MFSFET type is advantageous in terms of high integration and non-destructive readout, this type ferroelectric memory has not be realized yet due to the structural difficulty in manufacturing; therefore, the capacitor type ferroelectric memory antecedes the MFSFET type in developing and launching into market presently.

The material for Ferroelectric used for the capacitor type ferroelectric memory is divided into $PbZr_{1-x}Ti_xO_3$ (PZT) and $SrBi_2Ta_2O_9$ (SBT). Although remanent polarization Pr of SBT material is smaller than the remanent polarization of PZT, SBT material has superior fatigue behavior which is a critical factor for a reliable memory element. Also, SBT material is favorable from ecological view point for pursuing lead-free ferroelectric memory.

However, when a ferroelectric capacitor is constructed using SBT as a Ferroelectric, there were following problems.

SBT has Orthorhombic structure with a property such as, a=5.522 Å, b=5.524 Å, and c=25.026 Å, the polarization moment appears only in a direction of "a" axis, in other words, the polarization moment does not appear in directions of "b" axis and "c" axis. Therefore, SBT is used for a ferroelectric capacitor composed of a substrate, a bottom electrode, a Ferroelectric, and a top electrode, in order to take advantage of polarization moment effectively, ferroelectric layer SBT should preferably be oriented in direction of "a" axis so as to make a direction of electric field and a polarization axis from the bottom electrode to the top electrode parallel each other (See Japanese Patent Application, Publication No. Hei 8-335672.) But, SBT has a layered structure; even though it is easy to be oriented in direction of "c" axis, it is very difficult to be oriented in direction of "a" axis. Also, in a non-oriented polycrystal layer, an angle between the polarization axis of each crystal grain and the charged electric field is not uniform; thus, the charged voltage when a domain inversion occur in each crystal grain is not uniform, and the angularity of hysteresis curve becomes inferior.

Here, if an epitaxial growth of SBT is possible on a Si single crystal substrate via any kind of buffer layer and a bottom electrode with a "c" axis slanting from the orthogonal direction towards the substrate, crystallinity improves and angularity of the hysteresis curve becomes improved. Also, it becomes possible to use the polarization moment which appears only in direction of "a" axis more effectively. In particular, if a metal oxide electrode having perovskite structure which is superior property in SBT and lattice-matching is used as a bottom electrode, and if epitaxial growth of such metal oxide is possible in (110) oriented in cubic system or pseudo-cubic system, or in (111)-orientation in such system, the epitaxial growth in which the "c" axis of SBT is slanting by 45 degrees or 55 degrees from the orthogonal direction towards the substrate. Furthermore, if it is assumed that "a" axis and "b" axis are oriented by poling, it is estimated that 71% (=sin 45 degrees) and 82% of the polarization moment (=Sin 55 degrees) in case "a" axis is oriented perfectly can be used effectively respectively.

An object of the present invention is to provide a capacitor type ferroelectric memory having superior remanent polarization property and superior angularity on hysteresis curve performing an epitaxial growth of SBT ferroelectric layer on Si single crystal substrate in manner of "c" axis slanting from the orthogonal direction towards the substrate by using a buffer layer and a bottom electrode layer.

BRIEF SUMMARY OF THE INVENTION

Hereafter, also in the embodiments and claims, numerals accompanied by the parenthesis like (010) or (100) indicate the condition of orientation such as disposing direction of the single crystal or the like.

A ferroelectric memory of the invention is characterized in comprising Si single crystal substrate, a buffer layer composed of metal oxide on the Si single crystal substrate, a bottom electrode layer including either a conductive oxide having perovskite structure or a metal platinum Pt on the buffer layer, a ferroelectric layer composed of $SrBi_2Ta_2O_9$ having a layered perovskite structure on the bottom electrode layer, a top electrode layer on the ferroelectric layer.

According to the above structure, epitaxaial growth of $SrBi_2Ta_2O_9$ ferroelectric layer is possible on a Si single crystal substrate, and an effect that ferroelectric memory having superior angularity in hysteresis curve is obtained.

A ferroelectric memory in a ferroelectric memory according to the above is also characterized in that Si single crystal substrate is a substrate (100), metal oxide having fluorite structure including either a yttrium stabilized zirconia YSZ or a cerium oxide $CeO_2$ is (100)-oriented in cubic system in a buffer layer, the bottom electrode layer is in (110)-orientation in cubic system or in (110)-orientation in pseudo-cubic system, the ferroelectric layer is in (116)-orientation in orthorhombic system or in (117)-oriented.

According to the above structure, epitaxial growth of $SrBi_2Ta_2O_9$ ferroelectric layer is possible on a Si single crystal substrate (100) in manner of "c" axis slanting by approximately 45 degrees from the orthogonal direction towards the substrate. Therefore, an effect that ferroelectric memory having superior angularity in hysteresis curve and obtained and 71% of polarization moment can be used.

A ferroelectric memory in a ferroelectric memory according to the above is also characterized in that Si single crystal is a substrate (110), a buffer layer is composed of metal oxide MO (M=Mg, Ca, Sr, Ba) having NaCl structure being in (110)-orientation in cubic system, a bottom electrode layer is oriented in cubic or in (110)-orientation in pseudo-cubic system, a ferroelectric layer is in (116)-orientation in orthorhombic system or in (117)-orientation.

According to the above structure, epitaxial growth of $SrBi_2Ta_2O_9$ ferroelectric layer is possible on a Si single crystal substrate (110) in manner of "c" axis slanting by approximately 45 degrees from the orthogonal direction towards the substrate. Therefore, an effect that ferroelectric memory having superior angularity in hysteresis curve and obtained and about 71% of polarization moment can be used.

A ferroelectric memory in a ferroelectric memory according to the above is also characterized in that Si single crystal is a substrate (111), a buffer layer is composed of metal oxide MO (M=Mg, Ca, Sr, Ba) having NaCl structure being in (111)-orientation in cubic system, a bottom electrode layer is oriented in cubic system or in (111)-orientatin in pseudo-cubic system, a ferroelectric layer is in (103)-orientation in orthorhombic system or in (104)-orientation.

According to the above structure, epitaxial growth of $SrBi_2Ta_2O_9$ ferroelectric layer is possible on a Si single crystal substrate (111) in manner of "c" axis slanting by approximately 55 degrees from the orthogonal direction towards the substrate. Therefore, an effect that ferroelectric memory having superior angularity in hysteresis curve and obtained and about 82% of polarization moment can be used.

A ferroelectric memory in a ferroelectric memory according to any of the above is also characterized in that a memory cell including a bottom electrode layer, a ferroelectric layer, and a top electrode layer is disposed in matrix.

According to the above structure, in a ferroelectric memory constructed by a so-called memory cell array, superior angularity on the hysteresis curve can be realized.

A ferroelectric memory in a ferroelectric memory according to the above is also characterized in that the bottom electrode layer has a plurality of bottom stripe electrode disposed in manner of approximate striped parallel with intervals each other, the top electrode layer has a plurality of top stripe electrode disposed in manner of approximate striped parallel with intervals each other in the direction orthogonal to the disposing direction of the bottom stripe electrode, the memory cell is formed intercrossing area of the bottom stripe electrode and the top stripe electrode.

According to the above structure, by charging the electric current to the bottom stripe electrode corresponding to the memory cell and the top stripe electrode, it becomes possible to select the memory cell.

An electronic apparatus according to the invention is characterized in being provided with the ferroelectric memory according to anyone of the above.

According to the above structure, the ferroelectric memory has compatibility of memory characteristics and integrity; therefore, reliable and small electronic apparatus can be obtained.

DETAILED DESCRIPTION OF PRESENT INVENTION

Preferable embodiment of the present invention is explained as follows with reference to the drawings.

Figure 1:
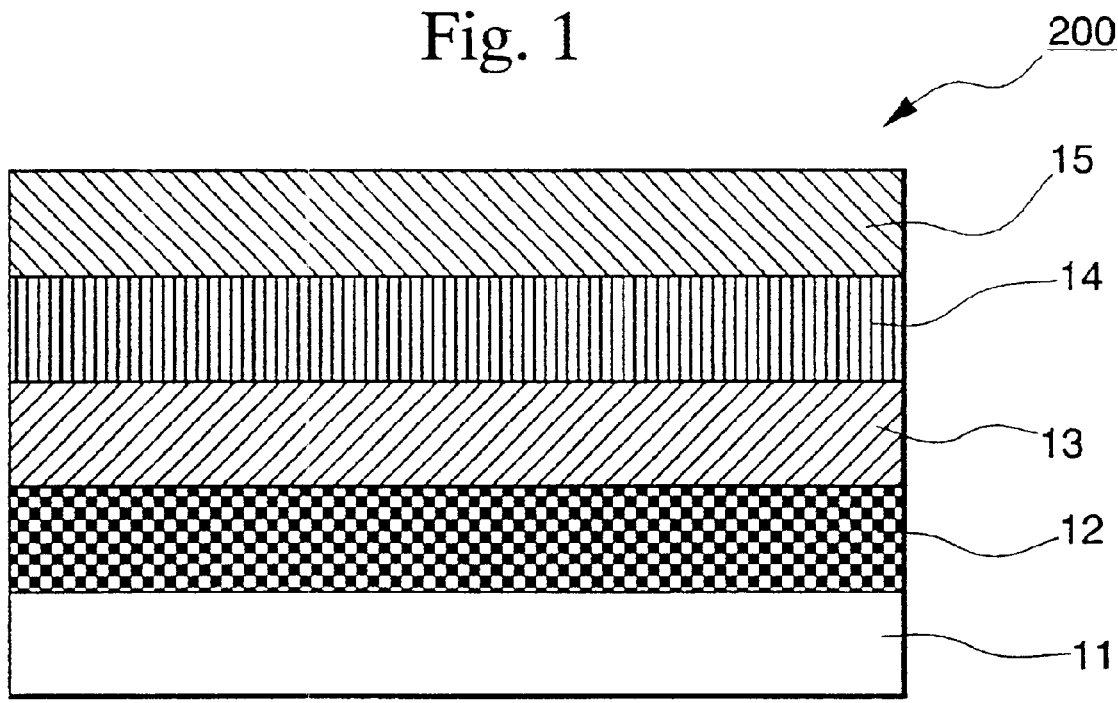
FIG. 1 is a cross section showing the first to third embodiments of the ferroelectric memory of the present invention.
Figure 2:
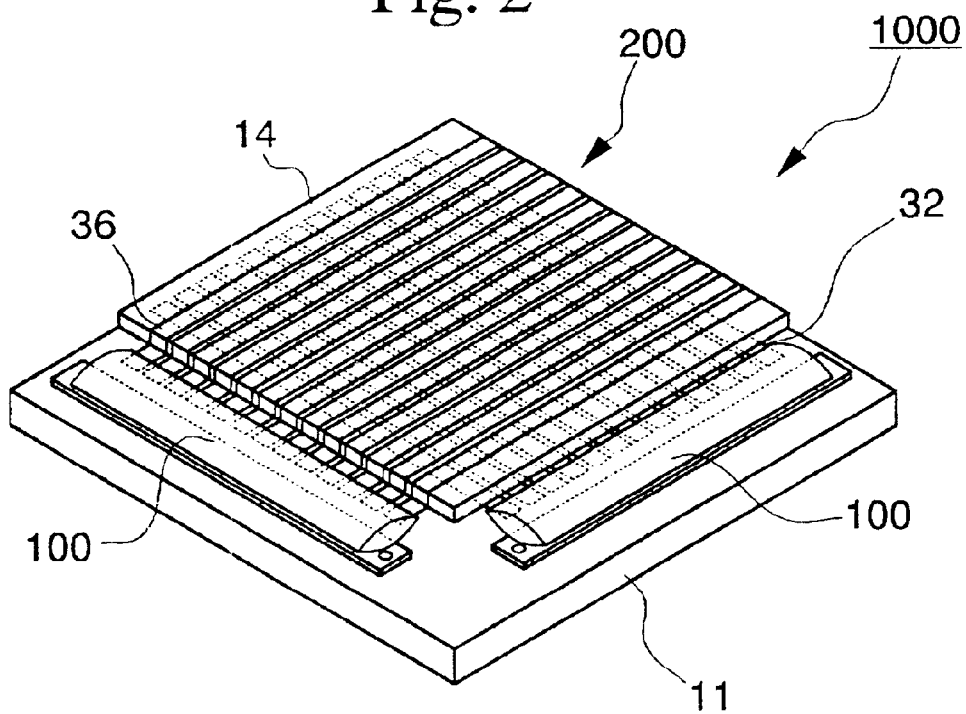
FIG. 2 is a perspective view of a memory cell array.
Figure 3:
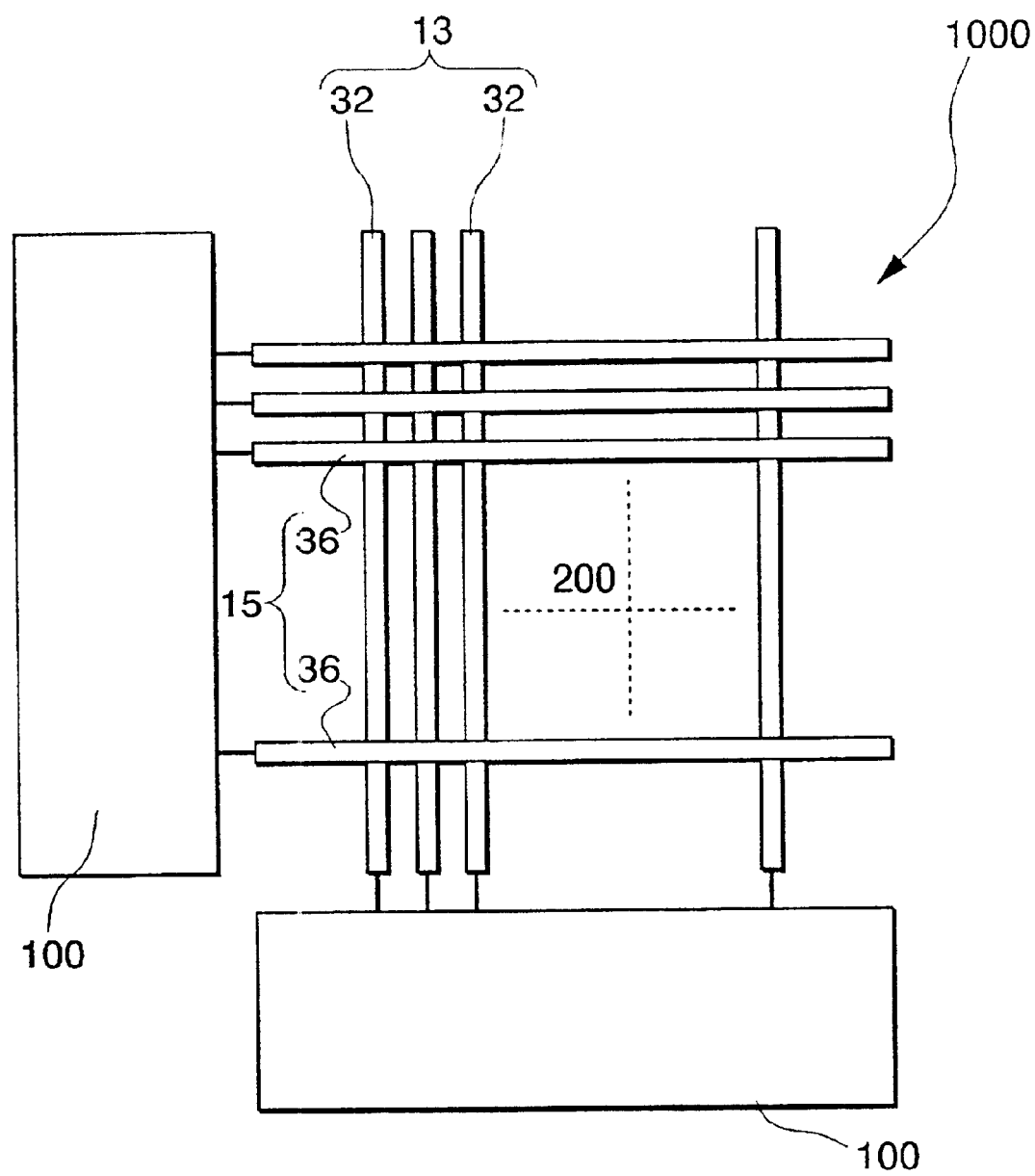
FIG. 3 is a plan view showing graphically a memory cell array.

FIG. 1 is a cross section of a memory cell which constructs the ferroelectric memory of the present invention. FIG. 2 is a perspective view of a memory cell array. FIG. 3 is a plan view graphically showing the memory cell array.

A ferroelectric memory 1000 of the present embodiment has a memory cell array 200 in which simple matrix structure is formed by using ferroelectric material and a peripheral circuit 100.

As shown in FIG. 1, the memory cell array 200 has a layered structure in which the ferroelectric layer 14 is disposed between a bottom electrode layer 13 and the top electrode layer 15. As shown in FIG. 3, the bottom electrode layer 13 has a plurality of bottom stripe electrode 32 (word line) disposed in manner of approximate striped parallel with intervals each other for the purpose of row selection. The top electrode layer 15 a plurality of top stripe electrode 36 (bit line) disposed in manner of approximate striped parallel with intervals each other in orthogonal direction to the disposing direction of the bottom stripe electrode 32, for the purpose of row selection. In addition, a signal electrode may have reverse structure to above construction, the bottom electrode may be a bit line, and the top electrode may be a word line. Furthermore, the memory cell formed by the ferroelectric capacitor is constructed in an intercrossing area of the bottom stripe electrode 32 and the top stripe electrode 36. Also, the bottom stripe electrode 32 and the top stripe electrode 36 are connected electrically to the peripheral circuit 100 respectively by the wiring layer.

The peripheral circuit 100 includes various circuits for writing and reading of information selectively on the memory cell. Various circuits are for example a driving circuit for controlling the bottom stripe electrode 32 selectively, a driving circuit for controlling the top stripe electrode 36 selectively, and a signal detection circuit such as a sense amplifier. Also, although not shown in the drawings, the peripheral circuit 100 is formed on the Si single crystal substrate 11, and the peripheral circuit 100 includes a MOS transistor having a gate insulating layer, a gate electrode, and source/drain region. The peripheral circuit 100 and a memory cell array 200 are connected electrically by a wiring layer.

Next, one example of writing and reading operation at the ferroelectric memory 1000 in the present embodiment is explained.

At first, in the reading operation, read-out voltage V0 is impressed on a selective cell. This operation is also an operation of writing "0 (zero)". Then electrical current of the selected bit line, or the electrical potential when the impedance of the bit line is high is read by the sense amplifier. At this time, a predetermined voltage is impressed on the non selective cell in order to avoid a cross-talk during the read-out operation.

In writing operation, when "1 (one)" is written, the voltage—V0 is impressed on the selective cell. When "0 (zero)" is written, the voltage which does not invert the polarization of the selective cell is impressed, the state that "0 (zero)" is written is maintained at the time of read-out operation. At this time, a predetermined voltage is impressed on the capacitor of non selective cell in order to prevent the cross-talk during the writing operation.

Consequently, each memory cell is explained in detail.

FIRST EMBODIMENT

FIG. 1 is a cross section showing the first embodiment of a ferroelectric memory (memory cell).

5 nm of buffer layer 12 composed of YSZ having fluorite structure was layered on a (100) Si single crystal substrate 11 under condition that the temperature of the substrate is 700 degrees Celsius and partial pressure of oxygen is $1\times10^{-5}$ Torr with laser abrasion method using yttrium stabilized zirconia YSZ target. The temperature of the substrate and the partial pressure of oxygen are not limited above conditions.

Next, 100 nm of $SrRuO_3$ bottom electrode layer 13 having perovskite structure was layered on a buffer layer 12 composed of YSZ under condition that the temperature of the substrate is 700 degrees Celsius and partial pressure of oxygen is $1\times10^{-2}$ Torr with laser abrasion method using $SrRuO_3$ target. The temperature of the substrate and the partial pressure of oxygen are not limited above conditions.

Furthermore, 100 nm of $SrBi_2Ta_2O_9$ ferroelectric layer 14 having layered-perovskite structure was layered on a $SrRuO_3$ bottom electrode layer 13 under condition that the temperature of the substrate is 700 degrees Celsius and partial pressure of oxygen is $1\times10^{-2}$ Torr with laser ablation method using $SrBi_2Ta_2O_9$ target. The temperature of the substrate and the partial pressure of oxygen are not limited above conditions.

At last, 100 nm of $SrRuO_3$ top electrode layer 15 having perovskite structure was layered on a $Sr_{0.8}Bi_{2.2}Ta_2O_9$ ferroelectric layer 14 under condition that the temperature of the substrate is 700 degrees Celsius and partial pressure of oxygen is $1\times10^{-2}$ Torr with laser ablation method using $SrRuO_3$ target. The temperature of the substrate and the partial pressure of oxygen are not limited above conditions.

When electrical resistance ratio on the surface of the obtained top electrode is measured with 4 (four) terminal method, the value such as $\rho=200\mu\,\Omega$ cm was obtained, and the temperature dependence which is similar to the case of the metal was observed in broad range of temperature between 50K and the room temperature.

As the structure of the capacitor which was obtained, (110) $SrRuO_3$ was on the top, then (116) $SrBi_2Ta_2O_9$ was layered thereunder, (110)$SrRuO_3$ was layered thereunder, (100)YSZ was layered thereunder, the (100) Si was layered at the bottom. With regards to $SrBi_2Ta_2O_9$, $SrRuO_3$, and YSZ, indexing method for orthorhombic, pseudo-cubic, and cubic is employed. Also, a part of $SrBi_2Ta_2O_9$ was in (117)-orientation.

According to polarization-electric field (P-E) hysteresis analysis on the obtained ferroelectric capacitor by impressing electric field such as 1 kHz of frequency and 100 kV/cm of amplitude, it was observed that characteristic such as remanent polarization: $Pr=14\mu$ $C/cm^2$, and coercive electric field: Ec=10 kV/cm was achieved, and the deterioration of Pr did not occur even if polarization reversal was performed more than $10^{12}$ times. This result indicates that the characteristics of above ferroelectric memory is more superior than the characteristics such as remanent polarization: $Pr=7\mu$ $C/cm^2$, and coercive electric field: Ec=20 kV/cm when performing the polarization reversal $10^{11}$ times in the case of ferroelectric capacitor having non-oriented $SrBi_2Ta_2O_2$ which was grown on the (100) Si single crystal substrate (100) without a buffer layer composed of YSZ.

Here, if the composition of $SrBi_2Ta_2O_9$ is altered in the range of $Sr_{1-x}Bi_{2+x}(Ta_{1-y}Nb_y)_2O_9$ ($0\leq x\leq 0.2$, $0\leq y\leq 1$), similar effect can be obtained. Also, if $MRuO_3$ (M=Ca, Ba), $La_{1-x}Sr_xMnO_3$, $La_{1-x}Sr_xCoO_3$, Pt are used for electrode layer in place of $SrRuO_3$, similar effect can be obtained.

As above explained, by performing epitaxial growth of (116) orientation SBT ferroelectric layer on the (100) Si single crystal substrate by a buffer layer composed of metal oxide having fluorite structure, it becomes possible to improve Pr, Ec, and the fatigue behavior of the ferroelectric memory.

SECOND EMBODIMENT

FIG. 1 is a cross section showing the second embodiment of the ferroelectric memory of the present invention, therefore FIG. 1 shows the same structure as is shown in the first embodiment. However, the direction of disposition of the layer and the substrate, and the material are different from the case of the first embodiment.

5 nm of buffer layer 12 composed of SrO having NaCl structure was layered on a (110) Si single crystal substrate 11 under condition that the temperature of the substrate is 700 degrees Celsius and partial pressure of oxygen is $1\times10^{-6}$ Torr with laser abrasion method using $SrO_2$ target. The temperature of the substrate and the partial pressure of oxygen are not limited above conditions.

Next, 100 nm of $SrRuO_3$ bottom electrode layer 13 having perovskite structure was layered on a buffer layer 12 composed of SrO under condition that the temperature of the substrate is 700 degrees Celsius and partial pressure of oxygen is $1\times10^{-2}$ Torr with laser abrasion method using $SrBi_2Ta_2O_9$ target. The temperature of the substrate and the partial pressure of oxygen are not limited above conditions.

Furthermore, 100 nm of $SrBi_2Ta_2O_9$ ferroelectric layer 14 having layered-perovskite structure was layered on a $SrRuO_3$ bottom electrode layer 13 under condition that the temperature of the substrate is 700 degrees Celsius and partial pressure of oxygen is $1\times10^{-2}$ Torr with laser abrasion method using $SrBi_2Ta_2O_9$ target. The temperature of the substrate and the partial pressure of oxygen are not limited above conditions.

At last, 100 nm of $SrRuO_3$ top electrode layer 15 having perovskite structure was layered on a $SrBi_2Ta_2O_9$ ferroelectric layer 14 under condition that the temperature of the substrate is 700 degrees Celsius and partial pressure of oxygen is $1\times10^{-2}$ Torr with laser ablation method using $SrRuO_3$ target. The temperature of the substrate and the partial pressure of oxygen are not limited above conditions.

When electrical resistance ratio on the surface of the obtained top electrode is measured with 4 (four) terminal method, the value such as $\rho=200\mu\,\Omega$ cm was obtained, and the temperature dependence which is similar to the case of the metal was observed in broad range of temperature between 50K and the room temperature.

As the structure of the capacitor which was obtained, (110) $SrRuO_3$ was on the top, then (116) $SrBi_2Ta_2O_9$ was layered thereunder, (110)$SrRuO_3$ was layered thereunder, (110)SrO was layered thereunder, the (110) Si was layered at the bottom. With regards to $SrBi_2Ta_2O_9$, $SrRuO_3$, and SrO, indexing method for orthorhombic, pseudo-cubic, and cubic is employed. Also, a part of $SrBi_2Ta_2O_9$ was in (117)-orientation.

According to polarization-electric field (P-E) hysteresis analysis on the obtained ferroelectric capacitor by impressing electric field such as 1 kHz of frequency and 100 kV/cm of amplitude, it was observed that high electric characteristic such as remanent polarization: $Pr=14\mu$ $C/cm^2$, and coercive electric field: Ec=10 kV/cm was achieved, and the deterioration of Pr did not occur even if polarization reversal was performed more than $10^{12}$ times. This result indicates that the characteristics of above ferroelectric memory is more superior than the characteristics such as remanent polarization: $Pr=7\mu$ $C/cm^2$, and coercive electric field: Ec=20 kV/cm when performing the polarization reversal $10^8$ times in the case of ferroelectric capacitor having non-oriented $SrBi_2Ta_2O_9$ layer which was grown on the (110) Si single crystal substrate without a buffer layer composed of SrO.

Here, if the composition of $SrBi_2Ta_2O_9$ is altered in the range of $Sr_{1-x}Bi_{2+x}(Ta_{1-y}Nb_y)_2O_9$ ($0 \leq x \leq 0.2$, $0 \leq y \leq 1$), similar effect can be obtained. Also, if $MRuO_3$ (M=Ca, Ba), $La_{1-x}Sr_xMnO_3$, $La_{1-x}Sr_xCoO_3$, Pt are used for electrode layer in place of $SrRuO_3$, similar effect can be obtained.

As above explained, by performing epitaxial growth of (116) orientation SBT ferroelectric layer on the (110) Si single crystal substrate by a buffer layer composed of metal oxide having NaCl structure, it becomes possible to improve Pr, Ec, and the fatigue behavior of the ferroelectric memory.

THIRD EMBODIMENT

FIG. 1 is a cross section showing the third embodiment of the ferroelectric memory of the present invention, therefore FIG. 1 shows the same structures as is shown in the first and the second embodiments. However, the direction of disposition of the layer and the substrate, and the material are different from the case of the first and the second embodiment.

5 nm of buffer layer 12 composed of SrO having NaCl structure was layered on a (111) Si single crystal substrate 11 under condition that the temperature of the substrate is 700 degrees Celsius and partial pressure of oxygen is $1 \times 10^{-6}$ Torr with laser abrasion method using $SrO_2$ target. The temperature of the substrate and the partial pressure of oxygen are not limited above conditions.

Next, 100 nm of $SrRuO_3$ bottom electrode layer 13 having perovskite structure was layered on a buffer layer 12 composed of SrO under condition that the temperature of the substrate is 700 degrees Celsius and partial pressure of oxygen is $1 \times 10^{-2}$ Torr with laser ablation method using $SrRuO_3$ target. The temperature of the substrate and the partial pressure of oxygen are not limited above conditions.

Furthermore, 100 nm of $SrBi_2Ta_2O_9$ ferroelectric layer 14 having layered-perovskite structure was layered on a $SrRuO_3$ bottom electrode layer 13 under condition that the temperature of the substrate is 700 degrees Celsius and partial pressure of oxygen is $1 \times 10^{-2}$ Torr with laser ablation method using $SrBi_2Ta_2O_9$ target. The temperature of the substrate and the partial pressure of oxygen are not limited above conditions.

At last, 100 nm of $SrRuO_3$ top electrode layer 15 having perovskite structure was layered on a $SrBi_2Ta_2O_9$ ferroelectric layer 14 under condition that the temperature of the substrate is 700 degrees Celsius and partial pressure of oxygen is $1 \times 10^{-2}$ Torr with laser ablation method using $SrRuO_3$ target. The temperature of the substrate and the partial pressure of oxygen are not limited above conditions.

When electrical resistance ratio on the surface of the obtained top electrode is measured with 4 (four) terminal method, the value such as $\rho = 200\mu \Omega$ cm was obtained, and the temperature dependence which is similar to the case of the metal was observed in broad range of temperature between 50K and the room temperature.

As the structure of the capacitor which was obtained, (111) $SrRuO_3$ was on the top, then (103) $SrBi_2Ta_2O_9$ was layered thereunder, (111) $SrRuO_3$ was layered thereunder, (111)SrO was layered thereunder, the (111) Si was layered at the bottom. With regards to $SrBi_2Ta_2O_9$, $SrRuO_3$, and SrO, indexing method for orthorhombic, pseudo-cubic, and cubic is employed. Also, a part of $SrBi_2Ta_2O_9$ was (104) orientation.

According to polarization-electric field (P-E) hysteresis analysis on the obtained ferroelectric capacitor by impressing electric field such as 1 kHz of frequency and 100 kV/cm of amplitude, it was observed that characteristic such as remanent polarization: $Pr=16\mu$ $C/cm^2$, and coercive electric field: Ec=10 kV/cm was achieved, and the deterioration of Pr did not occur even if polarization reversal was performed more than $10^{12}$ times. This result indicates that the characteristics of above ferroelectric memory is more superior than the characteristics such as remanent polarization: $Pr=7\mu$ $C/cm^2$, and coercive electric field: Ec=20 kV/cm when performing the polarization reversal $10^8$ times in the case of ferroelectric capacitor having non-oriented $SrBi_2Ta_2O9$ which was grown on the (111) Si single crystal substrate without a buffer layer composed of SrO.

Here, if the composition of $SrBi_2Ta_2O_9$ is altered in the range of $Sr_{1-x}Bi_{2+x}(Ta_{1-y}Nb_y)_2O_9$ ($0 \leq x \leq 0.2$, $0 \leq y \leq 1$), similar effect can be obtained. Also, if $MRuO_3$ (M=Ca, Ba), $La_{1-x}Sr_xMnO_3$, $La_{1-x}Sr_xCoO_3$, Pt are used for electrode layer in place of $SrRuO_3$, similar effect can be obtained.

As above explained, by performing epitaxial growth of (103) orientation SBT ferroelectric layer on the (111) Si single crystal substrate by a buffer layer composed of metal oxide having NaCl structure, it becomes possible to improve Pr, Ec, and the fatigue behavior of the ferroelectric memory.

Next, examples of electronic device provided with the ferroelectric memory of the present embodiment are explained.

Figure 4A:
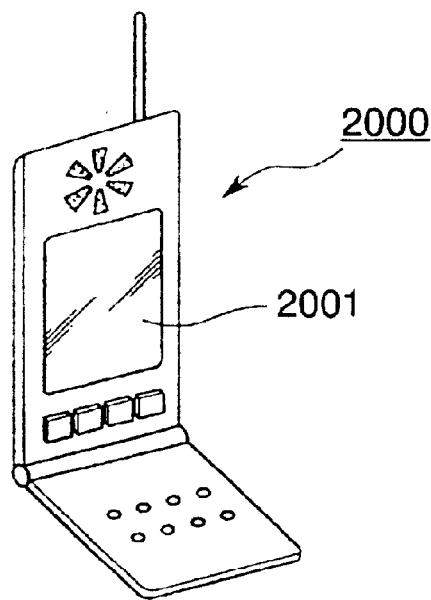
FIG. 4A is a perspective view showing an example of a mobile phone provided with a ferroelectric memory of the present invention.

FIG. 4A is a perspective view of an example of a mobile phone. In FIG. 4A, a reference numeral 2000 indicates a mobile phone unit in which a memory section 2001 using above ferroelectric memory is provided.

Figure 4B:
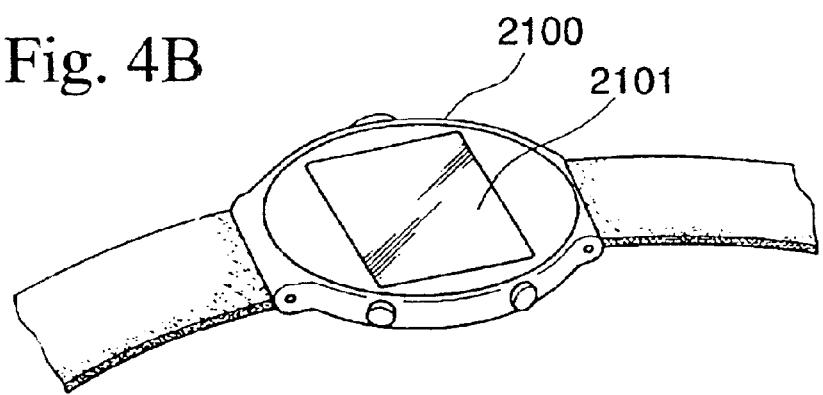
FIG. 4B is a perspective view showing an example of a wrist watch type electronic device provided with a ferroelectric memory of the present invention.

FIG. 4B is a perspective view showing an example of a wrist watch type electronic device. In FIG. 4B, a reference numeral 2001 indicates a wrist watch unit in which a memory section 2101 using above ferroelectric memory is provided.

Figure 4C:
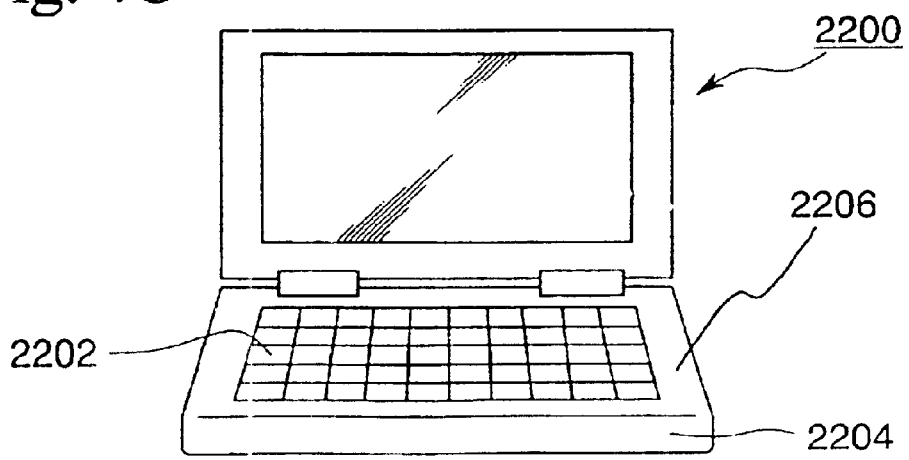
FIG. 4C is a perspective view showing an example of a mobile type information processing device provided with a ferroelectric memory of the present invention.

FIG. 4C is a perspective view showing an example of mobile type information processing device such as a word processor and a personal computer. In FIG. 4C, a reference numeral 2200 indicates an information processing device, a reference numeral 2202 indicates an input section such as a keyboard, a reference numeral 2204 indicates an information processing device unit in which a memory section 2206 using above ferroelectric memory is provided.

Also, although not shown in the drawings, as examples of other electronic devices, above ferroelectric memory can be applied to so called an IC card on which a memory section using above ferroelectric memory is provided.

In FIGS. 4A to 4C, electronic devices including an IC card are provided with the ferroelectric memory which compatibly has memory characteristics and integrity; therefore, reliable and small electronic apparatus can be realized.

The scope of the technology of the present invention is not limited to above embodiments, and various alteration and modification are possible as long as the change is in the scope of the object and intention of the present invention.

For example, above ferroelectric memory can be applied to so called a 1T1C type memory cell consisting an MOS transresistor and a capacitor and so called a 2T2C type memory cell consisting two MOS transresistors and two capacitors.

As above mentioned, according to the present invention, by performing epitaxial growth of metal oxide bottom electrode layer having perovskite structure using oxide metal having fluorite structure or NaCl structure as a buffer layer on Si single crystal substrate, and by performing epitaxial growth of ferroelectric layer composed of $Sr_{1-}$ $x\text{Bi}_{2+x}(\text{Ta}_{1-y}\text{Ta}_y)_2\text{O}_9$ ($0 \leq x \leq 0.5$, $0 \leq y \leq 1$) having layered perovskite structure in manner of "c" axis slanting from the orthogonal direction towards the substrate by 45 to 55 degrees, a ferroelectric memory and electronic device having superior angularity on the hysteresis curve and superior remanent polarizing behavior enabling the use of 71 to 82 percent of the polarization moment obtained in case that the alignment is performed in "a" axis perfectly can be obtained.

The entire disclosures of Japanese Patent Application Nos. 2001-088842 filed Mar. 26, 2001 and 2002-070806 filed Mar. 14, 2002 are incorporated by reference.

What is claimed is:

1. A ferroelectric memory comprising:
   an Si single crystal substrate;
   a buffer layer composed of metal oxide on the Si single crystal substrate;
   a bottom electrode layer including either a conductive oxide having a perovskite structure or a metal platinum Pt on the buffer layer;
   a ferroelectric layer composed of $\text{SrBi}_2\text{Ta}_2\text{O}_9$ or $\text{Sr}_{1-x}\text{Bi}_{2+x}(\text{Ta}_{1-y}\text{Nb}_y)_2\text{O}_9$ ($0 \leq x \leq 0.2$, $0 \leq y \leq 1$) having a layered perovskite structure on the bottom electrode layer; and
   a top electrode layer on the ferroelectric layers wherein the ferroelectric layer is in (116)-orientation in an orthorhombic system or in (117)-orientation.

2. A ferroelectric memory according to claim 1, wherein:
   a memory cell including the bottom electrode layer, the ferroelectric layer, and the top electrode layer is disposed in a matrix.

3. A ferroelectric memory according to claim 1, wherein:
   the bottom electrode layer has a plurality of bottom stripe electrodes disposed in an approximately striped parallel manner with intervals between each other;
   the top electrode layer has a plurality of top stripe electrodes disposed in an approximately striped parallel manner with intervals between each other in a direction orthogonal to a disposing direction of the bottom stripe electrodes; and
   the memory cell is formed at an intercrossing area of the bottom stripe electrodes and the top stripe electrodes.

4. An electronic apparatus provided with the ferroelectric memory according to claim 1.

5. A ferroelectric memory according to claim 1, wherein:
   the Si single crystal substrate is a (100) substrate;
   the metal oxide in the buffer layer has a fluorite structure including either a yttrium stabilized zirconia YSZ or a cerium oxide $\text{CeO}_2$ in (100)-orientation in a cubic system; and
   the bottom electrode layer is in (110)-orientation in a cubic system or in (110) orientation in a pseudo-cubic system.

6. An electronic apparatus provided with the ferroelectric memory according to claim 5.

7. A ferroelectric memory according to claim 1, wherein:
   the Si single crystal substrate is a (110) substrate;
   the buffer layer is composed of metal oxide MO (M=Mg, Ca, Sr, Ba) having an NaCl structure being in (110)-orientate ion in a cubic system; and
   the bottom electrode layer is in (110)-orientation in a cubic system or in (110)-oriented in a pseudo-cubic system.

8. An electronic apparatus provided with the ferroelectric memory according to claim 7.

9. A ferroelectric memory comprising:
   an Si single crystal substrate;
   a buffer layer composed of metal oxide on the Si single crystal substrate;
   a bottom electrode layer including either a conductive oxide having a perovskite structure or a metal platinum Pt on the buffer layer;
   a ferroelectric layer composed of $\text{SrBi}_2\text{Ta}_2\text{O}_9$ or $\text{Sr}_{1-x}\text{Bi}_{2+x}(\text{Ta}_{1-y}\text{Nb}_y)_2\text{O}_9$ ($0 \leq x \leq 0.2$, $0 \leq y \leq 1$) having a layered perovskite structure on the bottom electrode layer; and
   a top electrode layer on the ferroelectric layer,
   wherein the ferroelectric layer is in (103)-orientation in an orthorhombic system or in (104)-orientation.

10. An electronic apparatus provided with the ferroelectric memory according to claim 9.

11. A ferroelectric memory according to claim 9, wherein:
    the Si single crystal substrate is a (111) substrate;
    the buffer layer is composed of metal oxide MO (M=Mg, Ca, Sr, Ba) having an NaCl structure being in (111)-orientation in a cubic system; and
    the bottom electrode layer is in (111)-orientation in a cubic system or in (111)-orientation in a pseudo-cubic system.

12. An electronic apparatus provided with the ferroelectric memory according to claim 11.

* * * * *